TIME BASE FREQUENCY DIVIDER CIRCUIT

Filed Aug. 31, 1962 3 Sheets-Sheet 1

INVENTOR:
HANS R. SCHINDLER
BY Marvin A. Goldenberg
HIS ATTORNEY.

TIME BASE FREQUENCY DIVIDER CIRCUIT

Filed Aug. 31, 1962 3 Sheets-Sheet 2

INVENTOR:
HANS R. SCHINDLER,
BY Marvin Goldenberg
HIS ATTORNEY.

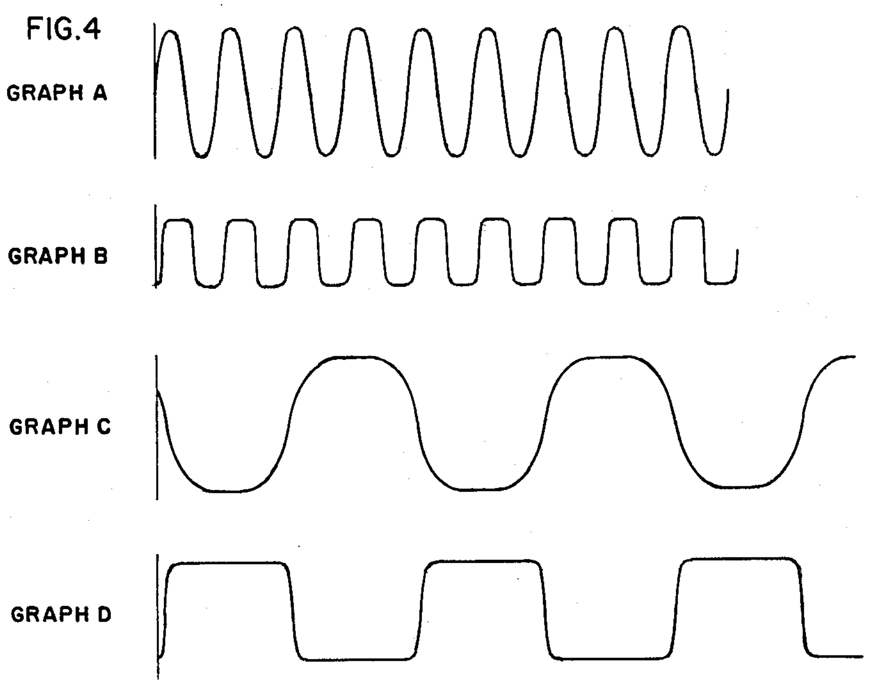
FIG.4
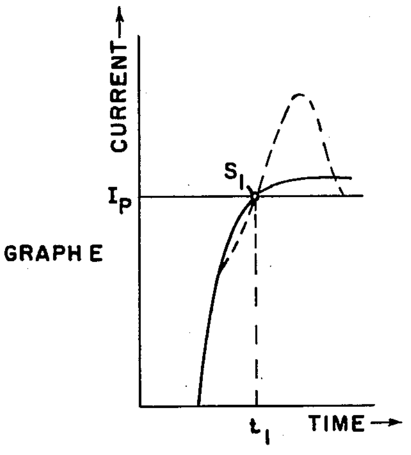
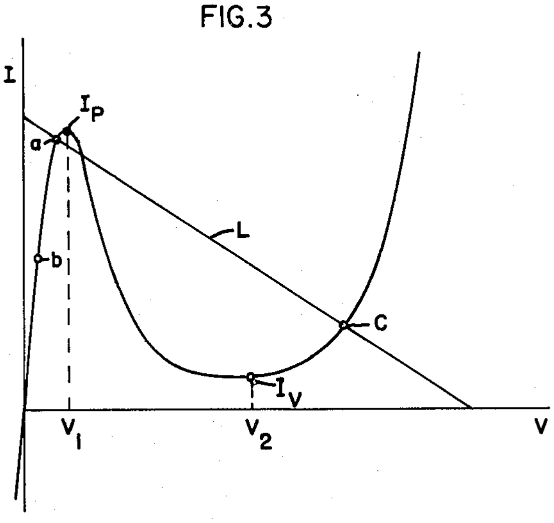
FIG.3
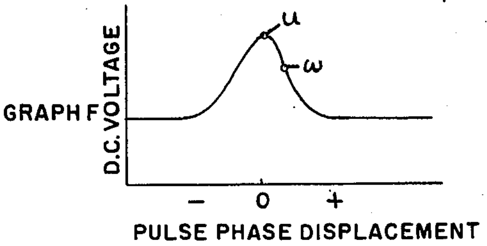
INVENTOR:
HANS R. SCHINDLER,
BY Marvin R. Goldenberg
HIS ATTORNEY.

United States Patent Office 3,144,566
Patented Aug. 11, 1964

3,144,566
TIME BASE FREQUENCY DIVIDER CIRCUIT
Hans R. Schindler, Syracuse, N.Y., assignor to General Electric Company, a corporation of New York
Filed Aug. 31, 1962, Ser. No. 220,618
7 Claims. (Cl. 307—88.5)

The present invention relates to novel time base frequency divider circuits of the type which, in response to an input signal of relatively high frequency, provide an output signal of a frequency that is an integral submultiple of the input frequency. More particularly the invention relates to highly stable time base frequency divider circuits employing a tunnel diode and capable of extremely high frequency operation, for example, in the kilomegacycle range. Such circuits have numerous applications and are especially useful with ultra high frequency sampling oscilloscopes.

In the oscilloscope art there has long been a requirement for high speed, low time jitter frequency divider circuits, also commonly termed countdown circuits, for exceedingly high frequency input signals. By time jitter is meant a phase shift between successive output signal cycles relative to the input signal. Circuits that have been previously employed have been not completely satisfactory in a number of respects. They are, for example, capable of stable operation for up to only a limited maximum frequency. In addition, the frequency division ratios of these circuits are limited. The present invention provides substantial improvement of the above characteristics.

Accordingly, one object of the present invention is to provide a novel time base frequency divider circuit capable of stable operation and low time jitter at frequencies up to and including the ultra high frequency range.

Another object of the present invention is to provide a novel stable time base frequency divider circuit capable of operating at large frequency division ratios.

Still another object of the present invention is to provide a time base frequency divider circuit capable of ultra high frequency operation which circuit includes an automatic locking loop for providing stable operation in the presence of circuit component or voltage instabilities, or input frequency changes.

In accordance with one aspect of the present invention there is provided a novel time base frequency divider circuit employing a tunnel diode which can be rapidly switched between a low voltage and a high voltage operating region. In response to a high frequency input signal applied thereto, said circuit provides an output signal at some frequency equal to an integral submultiple of the input frequency and in approximately constant phase relationship therewith so that exceedingly low time jitter exists between input and output signals. The output frequency is determined by a feedback loop in which is circulated a set signal the lagging edge of which is given a prescribed time delay equal to the period of said submultiple frequency. The feedback loop includes a pulse generator means, a long delay means and a pulse shaper coupled in the order recited between the output of the tunnel diode and the input thereto. In the preferred mode of operation the pulse shaped set signal is of sufficient amplitude to switch the tunnel diode so that its leading edge switches the diode to its low voltage state and its lagging edge switches the diode to its high voltage state. Switching to the high voltage state triggers the pulse generator and from the output thereof is extracted the output signal. In response to the application of the high frequency input signal, the amplitude of which is insufficient in itself to cause switching, in combination with the lagging edge of the set signal, switching of the tunnel diode occurs at a time corresponding to a fixed phase relationship between the applied signals, so as to provide an output signal of the recited stable characteristics.

In accordance with a second aspect of the invention an automatic lock-in circuit is provided for maintaining a locked in condition between the two signals applied to the tunnel diode in the presence of moderate drifts in the time delay of the feedback loop or frequency fluctuations in the high frequency input signal. Said additional feedback circuit includes an adder and detector network to which are applied pulses related to said two applied signals for deriving an error voltage which is coupled to the pulse generator means for controlling the delay of the feeback loop.

While the specification concludes with claims particularly pointing out and distinctly claiming the invention, it is believed that the invention will be better understood from the following description taken in connection with the accompanying drawings in which:

FIGURE 3 is a curve of the voltage-current characteristics of the tunnel diode employed in FIGURES 1 and 2; and FIGURE 4 is a series of graphs indicating various waveforms and curves employed in describing the circuits of FIGURES 1 and 2.

Figure 1:
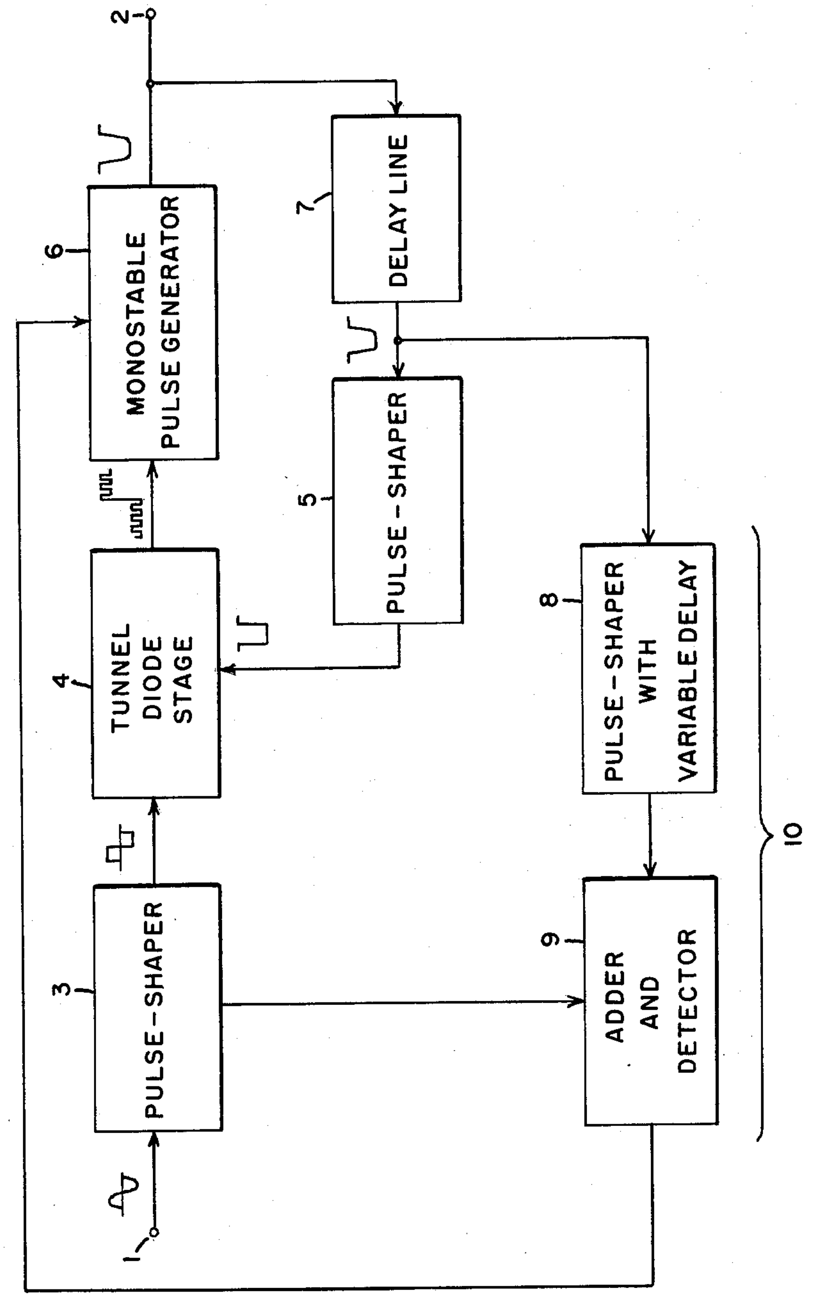
FIGURE 1 is a block diagram of a time base frequency divider circuit in accordance with the present invention.
Figure 2:
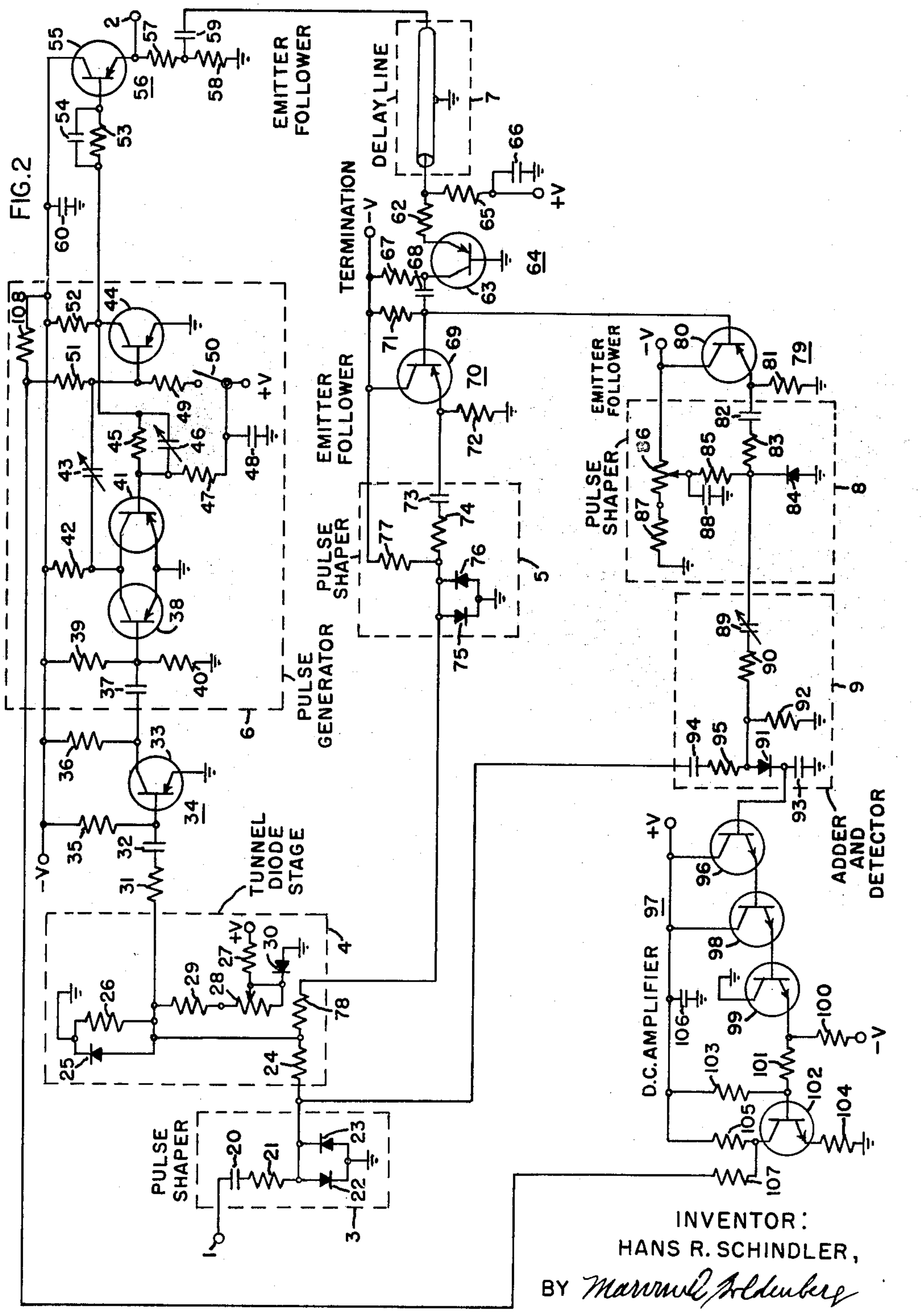
FIGURE 2 is a detailed schematic diagram of the circuitry of the present invention as outlined in the blocks of FIGURE 1.

Referring now to FIGURE 1, there is illustrated in block diagram form one embodiment of the time base frequency divider circuit of the present invention. A high frequency input signal in the range of approximately 5 megacycles to 3 kilomegacycles, is applied to an input terminal 1 for providing a synchronized output signal at an output terminal 2 of a frequency that is an integral submultiple of the input frequency. In addition, the output signal is essentially phase locked to the input signal. In one operative embodiment an input signal of 1 kilomegacycle was employed providing an output signal of 5 megacycles. Thus, the circuit is of advantage in providing a precise countdown from extremely high frequencies with a minimum of time jitter between output and input signals, e.g., less than 10 micro-microseconds. The input signal is normally of a sinusoidal waveform as illustrated in Graph A of FIGURE 4. It is coupled through a pulse-shaper 3 which for signals exceeding a given amplitude, e.g., 2 volts peak to peak, amplitude limits the input signal and steepens the slopes to provide at its output a very fast rise time rectangular pulse waveform, as shown in Graph B of FIGURE 4. A suitable circuit for pulse-shaper 3 is shown in FIGURE 2, and may include a pair of oppositely poled charge-storage diodes of the type described in an article appearing in the Proceedings of the IRE of January 1962 by J. L. Moll, S. Krakauer and R. Shen entitled "P-N Junction Charge-Storage Diodes." It may be noted that a slight time delay is provided by the pulse shaper due to the charge-storage action of the diode circuit contained therein. The output of the pulse-shaper 3, which hereinafter will be referred to as the trigger signal, is coupled as a first input to a tunnel diode stage 4. As illustrated in FIGURE 3, the tunnel diode of stage 4 is biased at a bias point "*b*" that is below the peak point $I_p$ of its voltage-current characteristic. A load line L is seen to be provided intersecting the voltage-current curve at stable operating points "*a*" and "*c*." The voltage-current characteristic includes a stable low voltage region, below $V_1$, and unstable negative resistance region, between $V_1$ and $V_2$, and a stable high voltage region, above $V_2$. In accordance with well known principles of tunnel diode operation, in response to an input current exceeding the peak current $I_p$, the diode will rapidly switch from its low voltage state to its high voltage state. Typically, switching occurs within .5 nanosecond. The amplitude of the trigger signal is of itself insufficient to raise the input current above the peak point $I_p$ so that the tunnel diode is not switched in response to the trigger signal alone.

Switching of the tunnel diode is accomplished, in a manner to be described in a greater detail below, in response to a second input in combination with the trigger signal, said second input being provided to the tunnel diode stage from a second pulse-shaped 5 contained in a feedback loop coupling the output of the tunnel diode stage to the input thereof. Said feedback loop includes a monostable pulse generator 6 which is typically a multivibrator, as shown in FIGURE 2. Other circuitry such as a blocking oscillator may also be suitable. Generator 6 is coupled to the output of said tunnel diode stage and is triggered to provide a pulse output in response to the tunnel diode being switched to the high voltage state. A delay line 7 providing a delay of approximately 100 nanoseconds in the embodiment being considered is coupled to the output of the pulse generator 6 for delaying the output pulse receive from said generator, said second pulse-shaper 5 being coupled to the output of delay line 7. The output terminal 2 may be seen to be coupled to the output of pulse generator 6. The output signal is illustrated in Graph C of FIGURE 4. For purposes of illustration, a ratio of 4 to 1 between input and output frequencies is shown, although it may be appreciated that this ratio in actual practice may be as high as 1000 to 1. The second input signal from pulse-shaper 5, which hereinafter will be referred to as the set signal, is essentially the output signal delayed by delay line 7 and shaped by pulse-shaper 5. The set signal waveform is illustrated in Graph D of FIGURE 4. Preferably, pulse generator 6 provides a negative going pulse so that the leading edge of the set signal resets the tunnel diode to the low voltage state and the lagging edge sets the tunnel diode to the high voltage state. The time delay given to the lagging edge in the feedback loop is provided primarily by the pulse generator 6, as a characteristic of the width of the generated pulse, and by the delay line 7. In a typical operation, the pulse width is about equal to the time delay of delay line 7.

In order that the recited integral submultiple relationship between output and input frequencies be maintained, it is necessary that the time delay of the feedback loop be always equal to the proper integral multiple period of the input signal. Accordingly, an automatic lock-in circuit 10 is provided including a third pulse-shaper 8 having variable delay and an adder and detector network 9. Pulse-shaper 8 is coupled to the output of delay line 7 and applies a first input to adder and detector network 9. As will be more clearly seen when considering FIGURE 2, the inputs to adder network 9 are first differentiated before being added and detected. The output of adder network 9 provides, within the proper range, a voltage proportional to any time delay error in the feedback loop. The error voltage is coupled to pulse generator 6 for controlling the width of the pulse generated therein, which will be seen to provide a vernier adjustment of the time delay of the feedback loop.

Considering now the operation of the circuit of FIGURE 1, the amplitude of the set signal exceeds that of the trigger signal, and preferably is sufficiently large so as to cause the tunnel diode input to slightly exceed the peak point $I_p$. Accordingly, in the preferred mode of operation, the tunnel diode can be triggered by the set signal alone, so as to switch from its low voltage state to its high voltage state. In the absence of a trigger signal the diode will switch at a time determined entirely by the application of the set signal. With the trigger signal also applied, the tunnel diode will switch at a time which is a function of the phase relationship between the trigger and set signals, and for the correct set signal frequency the output signal will be in synchronism with and locked to the phase of the input signal.

If we assume that operation is initiated by an external starting trigger applied to pulse generator 6, a pulse of determinable width is provided at the output of generator 6. This pulse is extracted at the output terminal 2 as the output signal and in addition is coupled to delay line 7. After being delayed, the pulse is amplitude limited and shaped by pulse-shaper 5 and applied to the tunnel diode input as the set signal. The leading edge of the pulse which has a sharply negative slope resets the tunnel diode to its low voltage state, and the lagging edge of the pulse, of sharply positive slope, switches the diode to its high voltage state. The output voltage of the tunnel diode triggers pulse generator 6 and in this manner the set signal is circulated through the feedback loop. The application of the trigger signal, and specifically the leading edge thereof, to the tunnel diode input determines the precise instant of switching. If we first assume that the time delay of the feedback loop is correct so that there is provided a set signal of the proper integral submultiple relationship with respect to the trigger signal, then the circuit operates to automatically lock the phase of the set signal to that of the trigger signal. Referring to Graph E of FIGURE 4, there is shown in solid outline the upper portion of the lagging edge of a set pulse. The composite waveform of a trigger pulse added to the set pulse is shown in dotted outline. In the absence of a trigger signal, it is seen that at point $s_1$, corresponding to time $t_1$, the peak current $I_p$ of the tunnel diode will be reached and the diode will switch by virtue of the set pulse alone. With a trigger pulse applied, switching will occur at some time corresponding to the phase relationship between the leading and lagging edges of the trigger and set pulses respectively. For a correct time delay of the feedback loop, providing the requisite integral frequency relationship between trigger and set signals, switching of the tunnel diode is constrained to occur at time $t_1$, as shown in Graph E, which now corresponds to a fixed phase relationship between trigger and set signals. It may be noted that if the time delay has a slight error, the output frequency may still be correct but slight time jitter will be introduced.

Any tendency for the time delay of the feedback loop to deviate from the correct value is automatically compensated for by the automatic lock-in circuit 10. This is accomplished as follows: The leading edge of the trigger pulse from pulse-shaper 3 and the lagging edge of the pulse from pulse-shaper 8, the latter corresponding to the lagging edge of the set pulse, are differentiated, added and peak detected in network 9. The output of network 9 is a voltage varying function of the relative phase displacement between the differentiated pulses, such as shown in Graph F of FIGURE 4 wherein the peak point $u$ corresponds to zero phase displacement. At point $w$, which corresponds to the requisite phase displacement between the differential pulses for providing switching of the tunnel diode at the proper time $t_1$, an output voltage is applied to pulse generator 6 which establishes the correct time delay in the feedback loop. A variation in this delay or a slight variation in the input signal frequency will generate an error voltage from adder detector network 9, which voltage is coupled to pulse generator 6 for adjusting the width of the pulse generated thereby and, accordingly, the time delay of the feedback loop, and the error voltage is returned to point $w$.

The amplitude of the set signal is said to be preferably sufficiently large so as to trigger the tunnel diode by itself, thereby maintaining the circuit in a ready condition to receive the trigger signal. However, it should be apparent that the set signal amplitude may be also adjusted to be slightly below that required for triggering the tunnel diode. For such condition simultaneous application of both set and trigger signals are required for switching the tunnel diode and the operation of the circuit is otherwise similar to that previously discussed.

We refer now to FIGURE 2 which exposes the individual blocks of FIGURE 1 and illustrates in detail the circuitry employed in one operable embodiment of the invention. Input terminal 1 is connected through serially connected D.C. blocking capacitor 20 and current limiting resistor 21 of pulse shaper 3 to a pair of oppositely poled charge-storage diodes 22 and 23 which amplitude limit the input signal and provide a steep sloped rectangular pulse at the output of pulse-shaper 3. The anode and cathode of diodes 22 and 23, respectively, are connected to resistor 21 and the opposing electrodes are commonly connected to ground. The output of pulse-shaper 3 is connected as a current source through a resistor 24 of relatively high resistance to the anode of tunnel diode 25, the cathode of diode 25 being connected to ground. In shunt with diode 25 is connected a load resistor 26. A biasing circuit for tunnel diode 25, including a D.C. voltage source $+v$, resistors 27, 28 and 29 and a voltage regulating zener diode 30, is also connected to the anode of tunnel diode 25. Source $+v$ is connected through resistor 27 to a tap on resistor 28. The tap is also connected to the cathode of zener diode 30, the anode thereof being connected to ground. Resistors 28 and 29 further connect the cathode of zener diode 30 to the anode of tunnel diode 25.

The output of tunnel diode 25 is connected from the anode thereof through a serially connected current limiting resistor 31 and D.C. blocking capacitor 32 to the base of transistor 33 of an amplifier stage 34 which amplifies the output voltage from tunnel diode 25 before it is applied to pulse generator 6. A biasing resistor 35 and load resistor 36 are coupled from a D.C. voltage source $-v$ to the base and collector, respectively, of transistor 33, the emitter thereof being connected to ground. An A.C. shorting capacitor 60 is connected in shunt with source $-v$. The collector of transistor 33 is coupled through a D.C. blocking capacitor 37 to the base of transistor 38 of pulse generator 6, which is in the described embodiment a monostable multivibrator. The base of transistor 38 is connected by a biasing resistor 39 to source $-v$ and by biasing resistor 40 to ground. The emitter and collector of transistor 38 are directly coupled to the emitter and collector, respectively, of transistor 41, the junction of said emitter electrodes being connected to ground. The junction of said collector electrodes is connected through a load resistor 42 to D.C. source $-v$, and through a variable capacitor 43 to the base of transistor 44. The collector of transistor 44 is connected through a resistor 45 and variable capacitor 46, coupled in shunt, to the base of transistor 41, which base is coupled through a biasing resistor 47 to the D.C. source $+v$. An A.C. shorting capacitor 48 is shunted around source $+v$ to ground. The base of transistor 44 is coupled through a biasing resistor 49 and switch 50 to source $+v$. A serial connection of biasing resistors 51 and 108 is connected between the base of transistor 44 and source $-v$. The collector of transistor 44 is connected through a load resistor 52 to source $-v$ and the emitter is connected directly to ground.

The collector of transistor 44 is coupled through the shunt combination of a resistor 53 and capacitor 54 to the base of transistor 55 of an emitter-follower amplifier 56. The collector of transistor 55 is connected directly to source $-v$. The emitter is connected to output terminal 2 and through a pair of load resistors 57 and 58 to ground. The junction of resistors 57 and 58 is coupled through a D.C. blocking capacitor 59 to the input of delay line 7, which in the present embodiment is an ordinary cable. Emitter-follower amplifier 56 provides an impedance match between pulse generator 6 and delay line 7.

The output of delay line 7 is coupled through resistor 62 to the emitter of transistor 63 of a termination network 64. Source voltage $+v$ is coupled through a biasing resistor 65 to the junction of resistor 62 and the output of delay line 7. An A.C. shorting capacitor 66 is coupled in shunt with source $+v$. A load resistor 67 is coupled between the collector of transistor 63 and D.C. voltage source $-v$. The output of termination stage 64 is coupled from the collector of transistor 63 through a D.C. blocking capacitor 68 to the base of transistor 69 of an emitter follower circuit 70 employed to drive pulse shaper 5. Source $-v$ is connected directly to the collector of transistor 69 and through biasing resistor 71 to the base thereof. The emitter of transistor 69 is coupled to ground through a load resistor 72 and is connected through a serially connected D.C. blocking capacitor 73 and current limiting resistor 74 to the junction of the anode and cathode of charge-storage diodes 75 and 76, respectively, for providing a drive to these diodes. This same junction is connected through a biasing resistor 77 to source $-v$ and through current source resistor 78 to the anode of tunnel diode 25 for applying the set pulse to diode 25. The junction of the cathode and anode of diodes 75 and 76, respectively is connected to ground. Charge-storage diodes 75 and 76 amplitude limit and pulse shape the output from delay line 7. Since the set pulses are of low frequency relative to the trigger pulses, it is important that the set pulses have extremely sharp edges, especially the lagging edge, so that a precise time of switching of tunnel diode 25 occurs, thereby providing a minimum of time jitter between trigger and set pulses.

The output of termination stage 64 is also connected to an emitter follower network 79 which drives pulse-shaper 8. Thus, the junction of capacitor 68 and resistor 71 is connected to the base of transistor 80, the collector thereof being coupled directly to source $-v$ and the emitter being connected through load resistor 81 to ground. The emitter is further connected through serially connected blocking capacitor 82 and current limiting resistor 83 to the cathode of a charge-storage diode 84 of pulse-shaper 8, the anode of said diode being connected to ground. The cathode of diode 84 is further connected through a biasing resistor 85 to a tap on a biasing resistor 86, one terminal of resistor 86 being connected to source $-v$ and the the other through an additional biasing resistor 87 to ground. The tap on resistor 86 is shunted through an A.C. shorting capacitor 88 to ground. Charge-storage diode 84 provides amplitude limiting as well as pulse shaping of only the positive half of the pulse received from the delay line 7. The biasing resistors 85 to 87 determine the delay of the pulse appearing across diode 84, resistor 86 providing a controllable delay.

The output of pulse shaper 8 is connected from the cathode of diode 84 through the series connection of a variable capacitor 89 and a resistor 90 to the junction of the anode of a peak detector diode 91 and a resistor 92 of adder and detector network 9. Resistor 92 is connected to ground and the cathode of diode 91 is connected through a smoothing capacitor 93 to ground. The output of pulse-shaper 3 is connected from the junction of the anode and cathode of diodes 22 and 23, respectively, through a serially connected capacitor 94 and resistor 95 to the junction of the anode of diode 91 and resistor 92. Capacitor 89 and resistors 90 and 92 differentiate the pulse from pulse-shaper 8. Capacitor 94 and resistors 92 and 95 differentiate the pulse output from pulse shaper 3. The positive differentiated pulses are added and peak detected by resistor 92, diode 91 and capacitor 93 and the summation voltage is connected from the junction of diode 91 and capacitor 93 to the base of transistor 96 of D.C. amplifier 97.

The D.C. amplifier stage 97 includes four stages of amplification. The emitter of transistor 96 is connected to the base of transistor 98, the emitter of transistor 98 being connected to the base of transistor 99 and the collector electrodes of transistor 96 and 98 being connected to D.C. source $+v$. The collector of transistor 99 is connected to ground and the emitter thereof is connected through a load resistor 100 to D.C. source $-v$. The emitter is also connected through a biasing resistor 101 to the base of transistor 102. The base of transistor 102 is also connected through a biasing resistor 103 to source $+v$. The emitter of transistor 102 is connected through a biasing resistor 104 to ground and the collector thereof is connected through a load resistor 105 to source $+v$. An A.C. shorting capacitor 106 is shunted around source $+v$. The output of D.C. amplifier stage 97 is coupled from the collector of transistor 102 through a current limiting resistor 107 to the biasing resistor 51 of the multivibrator of pulse generator 6 and through a biasing resistor 108 to source $-v$. In this manner the output voltage from D.C. amplifier stage 97 controls the bias supplied to the multivibrator transistors of pulse generator 6 for varying the width of the pulse generated therein.

In one exemplary operating embodiment of the invention the following circuit parameters were employed. These values are given for purposes of clearly setting forth the invention and are not intended to be construed as limiting.

| | |
|---|---|
| Resistor **104** | 10 ohms. |
| Resistor **62** | 40 ohms. |
| Resistors **21, 40, 53, 74, 83, 90, 92, 95** | 50 ohms. |
| Resistor **28** | 0–100 ohms. |
| Resistors **31, 57, 58** | 100 ohms. |
| Resistor **26** | 150 ohms. |
| Resistors **24, 42, 52, 72, 78, 81** | 200 ohms. |
| Resistors **36, 67** | 400 ohms. |
| Resistors **27, 100** | 500 ohms. |
| Resistor **29** | 660 ohms. |
| Resistors **65, 87, 101, 105** | 1K ohms. |
| Resistor **39** | 1.2K ohms. |
| Resistor **108** | 2K ohms. |
| Resistor **86** | 0.2.5K ohms. |
| Resistors **77, 85** | 3K ohms. |
| Resistor **45** | 3.3 K ohms. |
| Resistor **103** | 5K ohms. |
| Resistor **71** | 6K ohms. |
| Resistors **47, 51** | 12K ohms. |
| Resistors **35, 49, 107** | 30K ohms. |
| Capacitor **94** | 2 micro-microfarads. |
| Capacitors **43, 89** | 2–8 micro-microfarads. |
| Capacitor **46** | 6–18 micro-microfarads. |
| Capacitor **37** | 180 micro-microfarads. |
| Capacitors **48, 66, 88** | 1 nanofarad. |
| Capacitors **20, 32, 54, 56, 58, 59, 73, 82** | 10 nanofarads. |
| Capacitor **93** | .1 microfarad. |
| Capacitor **60** | 10 microfarads. |
| Diodes **22, 23, 75, 76, 84** | Type MA450C. |
| Diode **91** | Type HD5000. |
| Zener diode **30** | 5 volts breakdown. |
| Tunnel diode **25** | Type TD–311A. |
| Transistors **33, 38, 41, 44, 55, 63, 69, 80** | Type 2N769. |
| Transistors **96, 98** | Type 2N1613. |
| Transistors **99, 102** | Type 2N706. |
| Delay **7** | 50 ohm, .1 microsecond delay cable. |
| Voltage source $+v$ | +12 volts. |
| Voltage source $-v$ | −6 volts. |
| Input signal frequency | 1K mc. |
| Output signal frequency | 5 mc. |

Although the invention has been described with respect to a specific operable embodiment, for the purpose of full and clear disclosure, it may be appreciated that numerous modifications may be made that are in accordance with the basic teachings set forth. Accordingly, a conventional electrically adjustable delay line may be employed for delay line 7 and adjustment thereof provided by the output from the automatic lock-in circuit in lieu of or in combination with the delay adjustment provided to pulse generator 6. For such embodiment, the output from pulse generator 6 may readily be either a positive or a negative pulse. In addition, it may be clear that the delay line 7 and pulse generator 6 may be interchanged in their relative positions. As a further possible modification, two feedback paths of different time delays coupling the output of the tunnel diode stage to the input thereof may be provided wherein one of said paths provides a signal for resetting the tunnel diode to the low voltage region and the other of said paths provides a signal for setting the diode to the high voltage region.

The appended claims are to be construed as including these as well as other modifications that do not depart from the true scope of the invention.

What I claim as new and desire to secure by Letters Patent of the United States is:

1. A time base frequency divider circuit for converting an input signal of a first frequency to an output signal of a second frequency that is an integral submultiple of and in phase synchronism with said first frequency comprising:

(*a*) a tunnel diode means having a high voltage and a low voltage region of operation, said means rapidly switching from the low voltage region to the high voltage region when sufficiently energized so as to provide an output from which is derived said output signal, (*b*) first means for applying said input signal as a first input to said tunnel diode means at an amplitude below that required for switching, (*c*) a feedback loop for coupling the output of said tunnel diode means to the input thereof, said loop including the serial connection of a monostable pulse generator, a delay line and a pulse shaper, said pulse generator generating a pulse of determinable width having a leading and a lagging edge in response to said tunnel diode means being switched to said high voltage region, said leading edge being applied to the input of said tunnel diode means for causing switching thereof to the low voltage region and said lagging edge being applied to the input of said tunnel diode means in combination with said first input for causing switching of said tunnel diode means to said high voltage region at a time corresponding to an approximately fixed phase relationship between said first input and said lagging edge.

2. A time base frequency divider circuit as in claim 1 wherein said feedback loop provides said lagging edge with a time delay equal to the inverse of said second frequency.

3. A time base frequency divider circuit as in claim 1 including circuit means coupled to said feedback loop and to said first means for deriving an electrical signal indicative of an error in said time delay, said electrical signal being applied to said pulse generator for controlling the width of said generated pulse.

4. A time base frequency divider circuit as in claim 3 wherein said circuit means includes means for comparing the relative phase between the leading edge of said first input and the lagging edge of said second input so as to derive said electrical signal.

5. A time base frequency divider circuit for converting an input signal of a first frequency to an output signal of a second frequency that is an integral submultiple of and in phase synchronism with said first frequency comprising:

(*a*) negative resistance means having at least two stable regions of operation, said means rapidly switching from one stable region to another when sufficiently energized so as to provide an output from which is derived said output signal, (*b*) first means for applying said input signal as a first input to said negative resistance means at an amplitude below that required for switching, (*c*) feedback means for coupling the output of said negative resistance means as a second input thereto, said feedback means imparting to said second input a time delay equal to the inverse of said second frequency, said second input in combination with said first input causing switching of said negative resistance means so as to provide an output therefrom at a time corresponding to an approximately fixed phase relationship between said first and second inputs, and (*d*) circuit means coupled to said feedback means and to said first means for deriving an electrical signal indicative of an error in said time delay, said electrical signal being applied to said feedback means for controlling said time delay.

6. A time base frequency divider circuit for converting an input signal of a first frequency to an output signal of a second frequency that is an integral submultiple of and in phase synchronism with said first frequency comprising:

(*a*) negative resistance means having a high voltage and a low voltage region of operation, said means rapidly switching from the low voltage region to the high voltage region when sufficiently energized so as to provide an output from which is derived said output signal, (*b*) first means for applying said input signal as a first input to said negative resistance means at an amplitude below that required for switching, (*c*) feedback means for coupling the output of said negative resistance means to the input thereof for causing switching of said negative switching means to said low voltage region and for subsequently coupling a second input to said negative resistance means, said feedback means imparting to said second input a time delay equal to the inverse of said second frequency, said second input in combination with said first input causing switching of said negative resistance means to said high voltage region at a time corresponding to an approximately fixed phase relationship between said first and said second inputs, and (*d*) circuit means coupled to said feedback means and to said first means for deriving an electrical signal indicative of an error in said time delay, said electrical signal being applied to said feedback means for controlling said time delay.

7. A time base frequency divider circuit for converting an input signal of a first frequency to an output signal of a second frequency that is an integral submultiple of and in phase synchronism with said first frequency comprising:

(*a*) negative resistance means having at least two stable regions of operation, said means rapidly switching from one stable region to another when sufficiently energized so as to provide an output from which is derived said output signal, (*b*) first means for applying said input signal as a first input to said negative resistance means at an amplitude below that required for switching, (*c*) feedback circuit for coupling the output of said negative resistance means to the input thereof, said circuit including the serial connection of a monostable pulse generator and a pulse shaper, said pulse generator generating a pulse of determinable width having a leading and a lagging edge in response to said negative resistance means being switched to one stable region of operation, said pulse shaper providing a steepening of at least the lagging edge of said pulse, said leading edge being applied to the input of said negative resistance means for causing switching thereof to the other stable region of operation and said lagging edge being applied to the input of said negative resistance means in combination with said first input for causing switching of said negative resistance means to said one stable region of operation at a time corresponding to an approximately fixed phase relationship between said first input and said lagging edge.

References Cited in the file of this patent

UNITED STATES PATENTS

| | | |
|---|---|---|
| 3,031,621 | Schreiner | Apr. 24, 1962 |
| 3,040,185 | Horton | June 19, 1962 |
| 3,076,944 | Watters | Feb. 5, 1963 |